United States Patent [19]

Barson et al.

[11] 4,431,460

[45] Feb. 14, 1984

[54] METHOD OF PRODUCING SHALLOW, NARROW BASE BIPOLAR TRANSISTOR STRUCTURES VIA DUAL IMPLANTATIONS OF SELECTED POLYCRYSTALLINE LAYER

[75] Inventors: Fred Barson, Wappingers Falls; Bernard M. Kemlage, Kingston, both of N.Y.

[73] Assignee: International Business Machines Corporation, Armonk, N.Y.

[21] Appl. No.: 355,633

[22] Filed: Mar. 8, 1982

[51] Int. Cl.³ ............... H01L 21/425; H01L 21/265; H01L 21/74
[52] U.S. Cl. .................... 148/1.5; 29/576 B; 148/187; 357/34; 357/59; 357/91
[58] Field of Search ............ 148/1.5, 187; 29/576 B; 357/34, 59, 91

[56] References Cited

U.S. PATENT DOCUMENTS

| | | | |
|---|---|---|---|
| 3,460,007 | 8/1969 | Scott, Jr. | 317/235 |
| 4,146,413 | 3/1979 | Yonezawa et al. | 148/174 |
| 4,157,269 | 6/1979 | Ning et al. | 148/1.5 |
| 4,190,466 | 2/1980 | Bhattacharyya et al. | 148/1.5 |
| 4,226,650 | 10/1980 | Takahashi et al. | 148/188 |
| 4,259,680 | 3/1981 | Lepselter et al. | 357/59 |
| 4,263,067 | 4/1981 | Takahashi et al. | 148/190 |
| 4,280,854 | 7/1981 | Shibata et al. | 148/1.5 |
| 4,313,255 | 2/1982 | Shinozaki et al. | 29/576 B |
| 4,357,622 | 11/1982 | Magdo et al. | 148/1.5 |

OTHER PUBLICATIONS

IEEE Journal of Solid State Circuits, vol. SC-11, No. 4, Aug. 1976, by Braul et al., pp. 491–493.
IBM Technical Disclosure Bulletin, vol. 20, No. 1, Jun. 1977, by I. T. Ho et al., pp. 146–148.

Primary Examiner—Upendra Roy
Attorney, Agent, or Firm—George O. Saile

[57] ABSTRACT

A method for fabricating high performance NPN bipolar transistors which result in shallow, narrow base devices is described. The method includes depositing a polycrystalline silicon layer over a monocrystalline silicon surface in which the base and emitter regions of the transistor are to be formed. Boron ions are ion implanted into the polycrystalline silicon layer near the interface of the polycrystalline silicon layer with the monocrystalline silicon layer. An annealing of the layer structure partially drives in the boron into the monocrystalline silicon substrate. Arsenic ions are ion implanted into the polycrystalline silicon layer. A second annealing step is utilized to fully drive in the boron to form the base region and simultaneously therewith drive in the arsenic to form the emitter region of the transistor. This process involving a two-step annealing process for the boron implanting ions is necessary to create a base with sufficient width and doping to avoid punch-through. There is also described a method for forming NPN transistors in an integrated circuit.

20 Claims, 14 Drawing Figures

METHOD OF PRODUCING SHALLOW, NARROW BASE BIPOLAR TRANSISTOR STRUCTURES VIA DUAL IMPLANTATIONS OF SELECTED POLYCRYSTALLINE LAYER

FIELD OF THE INVENTION

The present invention is directed to a method for the manufacture of shallow, narrow base bipolar transistors. More particularly, the invention involves the method of forming the emitter and intrinsic base regions of a bipolar transistor using a polycrystalline silicon layer as the diffusion source of the N and P dopants.

BACKGROUND OF THE INVENTION

Ion implantation has been utilized for some time in the manufacture of NPN transistors. Typically, both the P base region and the N emitter region may be formed by the ion implantation method. Ion implantation causes damage during the implantation of the doping ions. This is normally cured by an annealing step. However, there are dislocation faults which do remain even after the annealing of the structure having the doping ions.

Methods for improving the direct ion implantation of bases and emitters directly into the monocrystalline silicon device region have been developed. U.S. Pat. No. 3,460,007 to Scott describes a method for forming a P-N junction wherein N doped polycrystalline silicon is deposited in situ on the surface of the monocrystalline silicon structure. The structure is subsequently heated to drive the N type conductivity ions into the surface of the monocrystalline silicon to form the N region. A further modification described in the publication by Graul et al., IEEE Journal of Solid State Circuits, Vol. SC-11, No. 4, August 1976, pp. 491-493, discusses a method for forming an emitter for an NPN transistor. In that method, an undoped polycrystalline silicon layer is deposited upon the surface of a monocrystalline silicon substrate. The polycrystalline silicon layer is then ion implanted with an N type ion, such as arsenic. The arsenic is then driven into the surface of the monocrystalline silicon to form the emitter region. U.S. Pat. No. 4,190,466 to A. Bhattacharyya et al. describes a method for using two layers of polycrystalline silicon as the dopant sources for diffusing boron and arsenic in consecutive operations to form the base and emitter regions, respectively of an NPN device.

K. Takahashi et al., U.S. Pat. Nos. 4,226,650 and 4,263,067 describe methods for forming PN regions in a monocrystalline semiconductor body by means of driving appropriate impurities from a silicon dioxide film. This process involves formation of a silicon dioxide film on the surface of the monocrystalline silicon body, the ion implantation of, for example, boron and arsenic impurities into the silicon dioxide film and heating the structure to diffuse the boron and arsenic simultaneously from the doped silicon dioxide layer to form the P type base layer and PN junction. The I. T. Ho et al. IBM Technical Disclosure Bulletin, Vol. 20, No. 1, June 1977, pp. 146–148 describes the formation of a PN junction useful in a charge-coupled device type storage element. The process utilizes polycrystalline silicon layer which has been formed on a monocrystalline silicon substrate. The polycrystalline silicon layer has boron and arsenic impurities therein. Upon heating the structure the boron which has a diffusion coefficient ten times higher than that of arsenic will diffuse more rapidly into the monocrystalline silicon to form a P layer region which surrounds the arsenic N region of the resulting structure.

SUMMARY OF THE PRESENT INVENTION

In accordance with the present invention there is described a method for fabricating high performance NPN bipolar transistors. The process results in shallow, narrow base devices. The method includes depositing a polycrystaline silicon layer over a monocrystalline silicon surface in which the base and emitter regions of the transistor are to be formed. Boron ions are ion implanted into the polycrystalline silicon layer near the interface of the polycrystalline silicon layer with the monocrystalline silicon layer. An annealing of the layer structure partially drives in the boron into the monocrystalline silicon substrate. Arsenic ions are ion implanted into the polycrystalline silicon layer. A second annealing step is utilized to fully drive in the boron to form the base region and simultaneously therewith drive in the arsenic to form the emitter region of the transistor. This process involving a two-step annealing process for the boron implanting ions is necessary to create a base with sufficient width and doping to avoid punch-through.

There is also described a method for forming NPN transistors in an integrated circuit. A silicon semiconductor body having regions of monocrystalline silicon dielectrically isolated from one another by dielectric isolating regions is provided. A mask over this body covers those regions designated to be the collector reach-through regions and open to those regions designated as the emitter, intrinsic base and extrinsic base regions. A first P type doped polycrystalline silicon layer is formed over the surface of the body wherein the polycrystalline silicon layer makes contact only to the designated base regions. The polycrystalline silicon layer is removed where the regions designated to be the emitter and intrinsic base are to be made. An insulating layer is formed over the first P type doped polycrystalline layer. A second polycrystalline layer is deposited over the regions in the said body designated to be the emitter and intrinsic base directly upon the monocrystalline silicon. Boron ions are ion implanted into the second polycrystalline silicon near the interface of the polycrystalline silicon layer with the monocrystalline silicon layer. The partial drive in of the boron into the monocrystalline silicon is accomplished by a first annealing step. The P type impurities from the first P doped layer also moves into the monocrystalline silicon body during this annealing step. Arsenic ions are ion implanted into the second polycrystalline silicon layer. A second annealing step is utilized to fully drive in the boron ions, the P type impurities and the arsenic ions into the appropriately designated regions to form the intrinsic base, extrinsic base and emitter of the NPN transistors. The process is ended by making electrical contacts to the appropriate elements of the NPN transistors.

DESCRIPTION OF THE PREFERRED EMBODIMENTS

Figure 1:
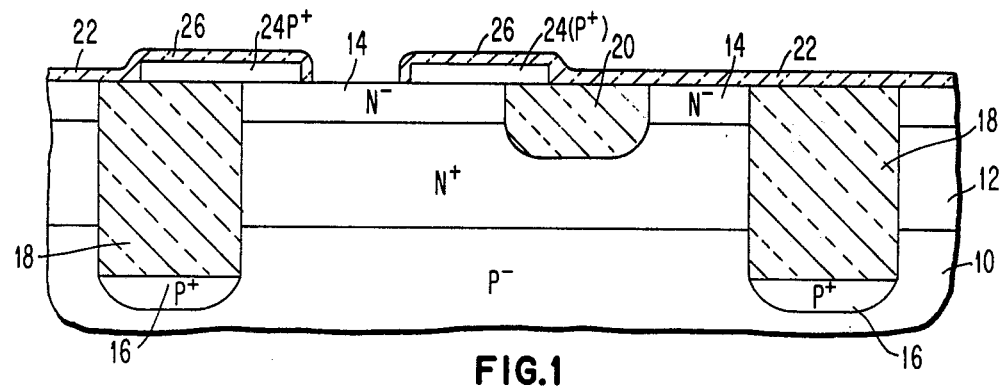
FIGS. 1 through 8 illustrate the method of fabricating one form of NPN bipolar transistor of the present invention.
Figure 2:
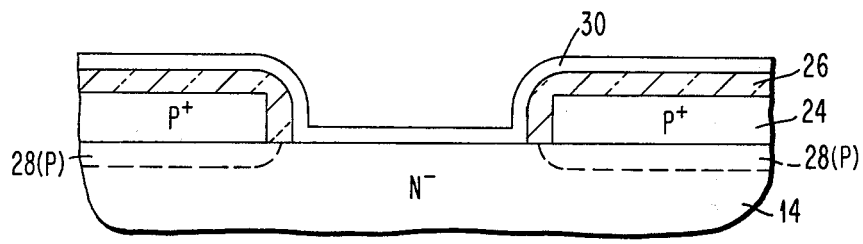

Referring now more particularly to FIG. 1 the manufacturing steps for one form of the invention, the device is fabricated by starting with the wafer or substrate 10 of P− monocrystalline silicon material. The process is illustrated to form a NPN bipolar device integrated circuit. However, it would be obvious that PNP bipolar device integrated circuits can alternatively be formed by simply reversing the polarities of the various elements of the transistors in the associated regions. The FIG. 1 illustrates one small, greatly enlarged portion of the silicon body which will be used to form the very dense bipolar transistor structure. The P− substrate 10 has a subcollector N+ diffusion 12 made therein. An epitaxial N layer 14 is then grown on top of the substrate. These processes are standard processes in the formation of, for example, NPN bipolar transistors. The substrate is typically <100> crystallographic oriented silicon having a resistance in the order of 1 to 20 ohm centimeters. The subcollector diffusion is typically formed using arsenic having a surface concentration of about $10^{20}$ atoms/cc. The epitaxial growth process to form the layer 14 may be done by conventional techniques, such as the use of silicon tetrachloride/hydrogen or silane/hydrogen mixtures at temperatures between about 1000° C. to 1200° C. During the epitaxial growth, the dopant in the N+ subcollector layer moves into the epitaxial layer to complete the formation of the subcollector layer 12. The thickness of the epitaxial layer for highly dense integrated circuits is of the order of 3 micrometers or less.

The next series of steps involve the formation of isolation means for isolating regions of monocrystalline silicon from other regions of monocrystalline silicon. The isolation may be back biasing PN junctions, partial dielectric isolation or complete dielectric isolation. The dielectric materials used may be silicon dioxide, glass, or combinations thereof, etc. The preferred isolation for highly dense integrated circuits is dielectric isolation. FIG. 1 shows a partial dielectric isolation with dielectric regions 18 and 20. The regions 18 isolate monocrystalline silicon regions from other monocrystalline silicon regions and region 20 isolates the base-emitter region from the collector reach-through region. P+ region 16 can also be formed in the substrate 10 in the designated areas under the dielectric isolation regions 18 to act as channel stops preventing inversion. There are many ways in the art to form dielectric regions of this type. One process for accomplishing this isolation is described in the Magdo et al. patent application, Ser. No. 150,609, filed June 7, 1971 or Peltzer U.S. Pat. No. 3,648,125. Alternatively, the partial dielectric isolation may be formed according to the methods described in either patent application Ser. No. 296,929 filed Aug. 27, 1981 by R. C. Joy et al. entitled "Isolation for High Density Integrated Circuits" or patent application Ser. No. 296,933 filed Aug. 27, 1981 by R. C. Joy et al. entitled "Isolation for High Density Integrated Circuits". In those patent applications and patent the processes for forming partial dielectric isolation for regions 16, 18 and 20 are described in detail.

A mask layer 22 is provided over the semiconductor body covering those regions designated to be collector reach-through regions and open to those designated the emitter, intrinsic base and extrinsic base regions. The mask layer may be a chemical vapor deposited silicon dioxide layer of about 200 nanometers in thickness. The preferred process for depositing such a layer is a conventional low pressure, low temperature chemical vapor deposited silicon dioxide using silane and oxygen at about 450° C. Alternatively, the mask layer 22 may be comprised of a combination of layers of silicon dioxide and silicon nitride or other materials.

The openings in layer 22 are formed by conventional photolithography and masking procedures. A first P type doped polycrystalline silicon layer 24 is formed uniformly over the surface of the silicon body wherein there are openings to the monocrystalline silicon body. The polycrystalline silicon body makes ohmic contact to these regions which are designated to be the extrinsic base regions. Elsewhere, the polycrystalline silicon layer is formed over the mask layer 22. The layer 24 may be deposited by use of a mixture of, for example, silane and diborane in a hydrogen ambient at 800° C. Other P type dopants can alternatively be used. Alternatively, the polycrystalline silicon may be formed undoped and then have the P type dopants ion implanted into its body to the desired doping concentration. The operative thicknesses of the polycrystalline silicon layer 24 is between about 250 to 1000 nanometers with 350 nanometers preferred. The preferred doping level is between about $1 \times 10^{18}$ to $1 \times 10^{21}$ atms/cc. A layer 26 of silicon dioxide is then formed preferably by conventional chemical vapor deposition over the layer 24. The preferred thickness of this silicon dioxide layer 26 is between about 100 to 500 nanometers. Photolithography and etching techniques are utilized to remove the silicon dioxide 26 and polycrystalline silicon layer 24 from all areas except the extrinsic base region. A layer of silicon dioxide is then grown and removed using an isotropic etch such as reactive ion etch to provide sidewall coverage of polysilicon region 24. This layer can be silicon dioxide or a combination of silicon dioxide and silicon nitride. For a more detailed description of the sidewall process, see J. Riseman U.S. Pat. No. 4,234,362 issued Nov. 18, 1980. This results in the formation of the FIG. 1 structure.

Referring now more particularly to FIGS. 2–8 for consideration of completion of the process of the present invention. These figures are an enlarged representation of the emitter-base designated portion of the FIG. 1 structure. A second polycrystalline silicon layer 30 is now uniformly deposited over the entire wafer by using preferably a low pressure chemical vapor deposition process which includes reacting silane, $SiH_4$, at a reactor pressure of about 500 millitorr and a reactor temperature of about 625° C. for a growth rate of about 10 nanometers/min. The polycrystalline silicon layer 30 is undoped as formed in situ to produce the FIG. 2 structure. The operative thickness of this polycrystalline silicon layer is between about 50 to 500 nanometers with 120 nanometers preferred. Should the thickness be greater than about 500 nanometers, it would be difficult to control the base width of the final structure. If the thickness is less than about 50 nanometers, it would be difficult to contain the major portion of the implanted impurities within the polycrystalline silicon layer 30.

Some slight diffusion of the P type dopant into the monocrystalline silicon 28 may occur as an incidental result of heat treatment during the formation of the sidewall. However, this dopant, which forms the extrinsic base of the transistor, is driven in to its final junction depth during subsequent thermal cycles.

Boron is next ion implanted into the polycrystalline silicon layer 30 to produce the positive ions 32 within the polycrystalline layer 30. The boron dose required is directly proportional to the thickness of the polycrystalline silicon layer 30, but should be adjusted to produce an average boron concentration in the polycrystalline silicon between about $5 \times 10^{18}/cm^3$ and $5 \times 10^{19}/cm^3$. For a polycrystalline layer of thickness 120 nm, for example, a boron dose between about $6 \times 10^{13}/cm^2$ and $6 \times 10^{14}/cm^2$, is appropriate. The implantation energy should be kept sufficiently low so that at least the substantial portion of the implanted boron is contained within the polycrystalline silicon layer 30. Once again, using the example of a 120 nm thick polycrystalline silicon film, an implantation energy of about 5 KeV is preferred. Alternatively, $BF_2^+$ ions may be implanted to provide the same average concentration of boron in the polycrystalline silicon layer, but due to the greater mass of the $BF_2^+$ ions, an implantation energy of approximately 25-30 KeV may be used to achieve a comparable implantation depth.

Figure 3:
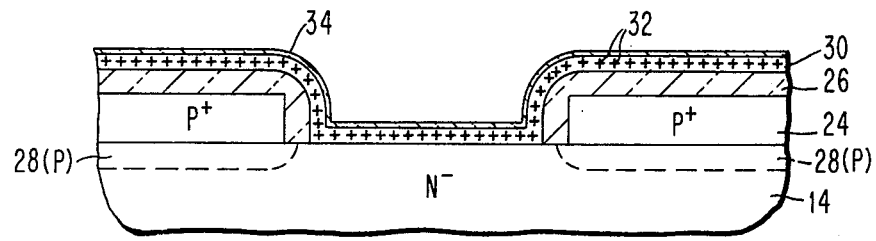

A capping layer 34 is preferably chemically vapor deposited upon the polysilicon layer 30 to result in the structure shown in FIG. 3. The thickness is typically between about 10 to 100 nanometers and is preferably silicon dioxide. The purpose of the capping layer is to prevent the outdiffusion of the boron ions from the polycrystalline silicon layer 30 to the ambient.

Figure 4:
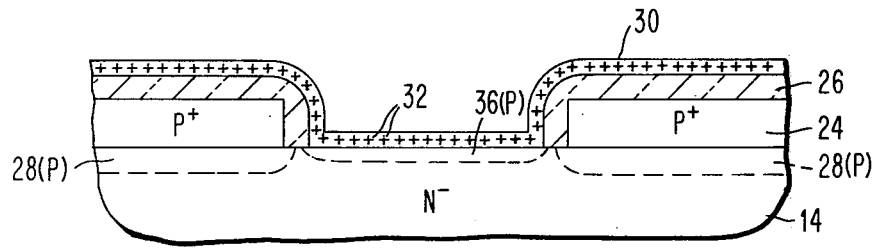

A first annealing or heating of the layered structure is accomplished to act as a pre-diffusion of the intrinsic base region. This process involves heating the FIG. 3 structure at a temperature between about 800° to 1000° C. in an inert atmosphere such as nitrogen or argon for a time of 500 to 10 minutes, respectively. It is preferred that the pre-diffusion annealing step be accomplished at 900° C. in nitrogen atmosphere for a time of about 120 minutes. A pre-diffused intrinsic base 36 as shown in FIG. 4 is the result of this process. The insulator 34 is removed as shown in the FIG. 4 structure.

It is necessary to have the first annealing or pre-diffusion to create a base with sufficient width and doping concentration to avoid punch-through whereas in the prior art a single annealing step was utilized to form P and N regions.

During the first annealing, the boron atoms diffuse much more rapidly in the polycrystalline silicon layer than in the underlying monocrystalline silicon. As a result, they redistribute rapidly during the initial part of the anneal to form a uniformly doped polycrystalline silicon layer. This doped layer then approximates a diffusion source with constant surface concentration for boron diffusion into the underlying monocrystalline silicon during the remainder of the annealing step. A desirable steep boron profile results. In prior art, where the boron profile is formed at a comparable depth by implantation directly into the monocrystalline silicon, the profile is less steep. This is generally attributed to channeling of some of the implanted ions along favorable crystallographic directions, creating a "tail" in the boron profile. In the present invention, since the boron is implanted at low energy into the polycrystalline silicon film, little or none of this "tail" penetrates into the monocrystalline layer. The final profile is now governed by diffusion, resulting in the steep slope desired for forming narrow base widths with adequate doping levels.

Figure 5:
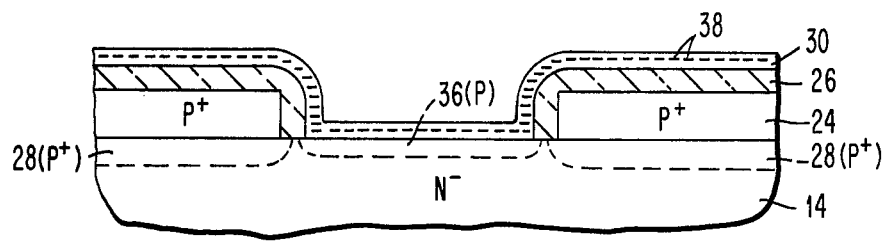

Referring now to FIG. 5 there is illustrated the result of the arsenic ion implant 38 which is shown as a negative ion in the polycrystalline silicon layer 30. Although the presence of boron ions 32 are not illustrated in the layers 30 they are in fact present in substantial numbers. The arsenic ion implant is preferably $1 \times 10^{15}$ to $1 \times 10^{16}$ atoms/cm² applied at an energy of 5 to 40 KeV in a vacuum. This dosage gives an average arsenic doping level in the polycrystalline silicon layer 30 of between $5 \times 10^{19}$ and $2 \times 10^{21}$ arsenic ions/cc. The preferred conditions are $4 \times 10^{15}$ atoms/cm² at 30 KeV for a polycrystalline layer of 120 nanometers.

Figure 6:
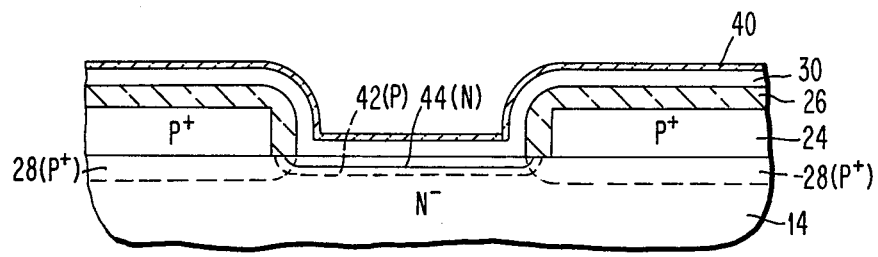

A capping layer 40 is applied as in FIG. 3 of between about 10 to 100 nanometers in thickness. It is preferred that this layer is of the same composition and is for the same purpose as the capping layer 34 of FIG. 3. The capping layer may be formed either by chemical vapor deposition or by thermal oxidation of the polycrystalline silicon layer 30 at a temperature of 900° C. in oxygen for 30 minutes. The result of this thermal silicon dioxide growth is a pre-emitter drive in of the arsenic ions into the monocrystalline silicon body. The complete drive in of the boron in the second polycrystalline silicon layer 30, the P type dopant in the first polycrystalline silicon layer 24 and the arsenic ions in the second polycrystalline layer 30 to produce the extrinsic base region 28, intrinsic base region 42 and emitter region 44 is accomplished between about 850° C. to 1000° C. in an inert atmosphere such as nitrogen or argon for a time of 400 to 6 minutes, respectively. The condition is preferably about 950° C. in nitrogen for 30 minutes. The result of this heating step is shown in FIG. 6. If desired, at least a portion of this drive in cycle can be done in an oxidizing ambient such as dry oxygen, which simultaneously forms the silicon dioxide cap without the need for a preliminary capping operation.

Figure 7:
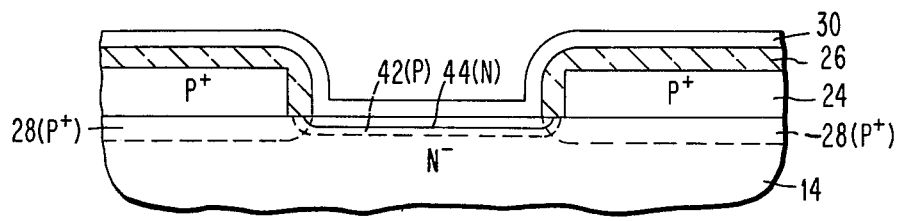

The thermally grown silicon dioxide cap 40 is removed by conventional etching to produce the FIG. 7 structure. The FIG. 7 structure has a PN base-emitter junction between about 20 to 200 nanometers in depth. The base width is between about 70 to 200 nanometers.

Figure 12:
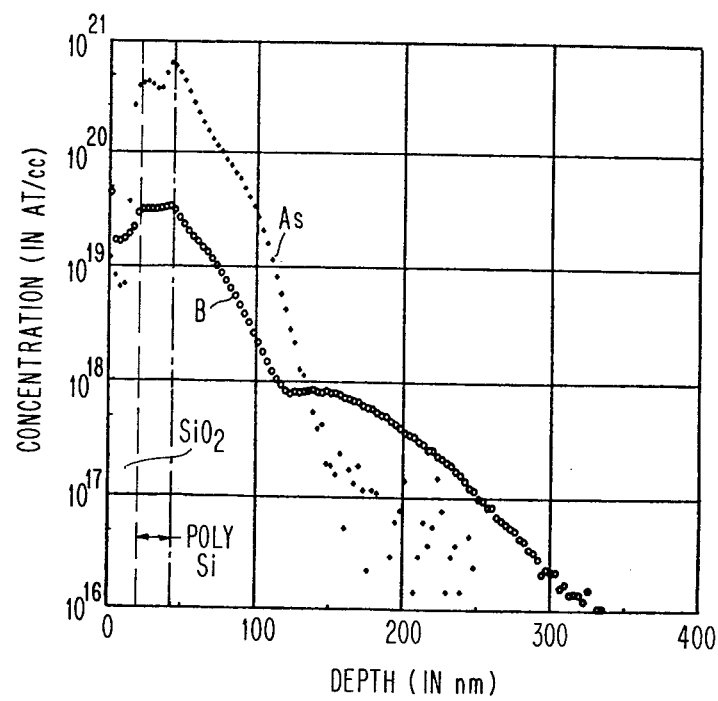
Figure 13:
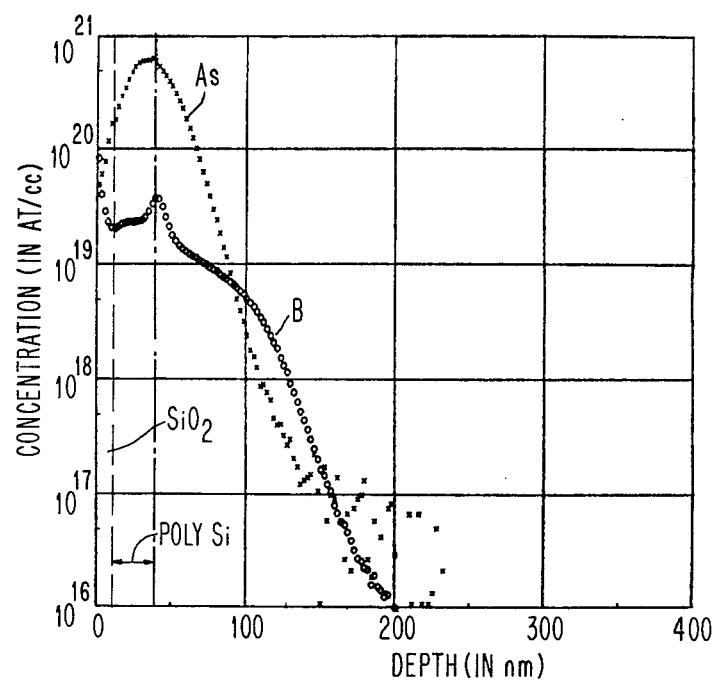
FIG. 13 is a diagram showing the diffusion profile prior to final arsenic drive in wherein a thinner than desirable polycrystalline silicon layer was used. There is an undesirable penetration of the arsenic ion implantation profile into the monocrystalline silicon beneath.
Figure 14:
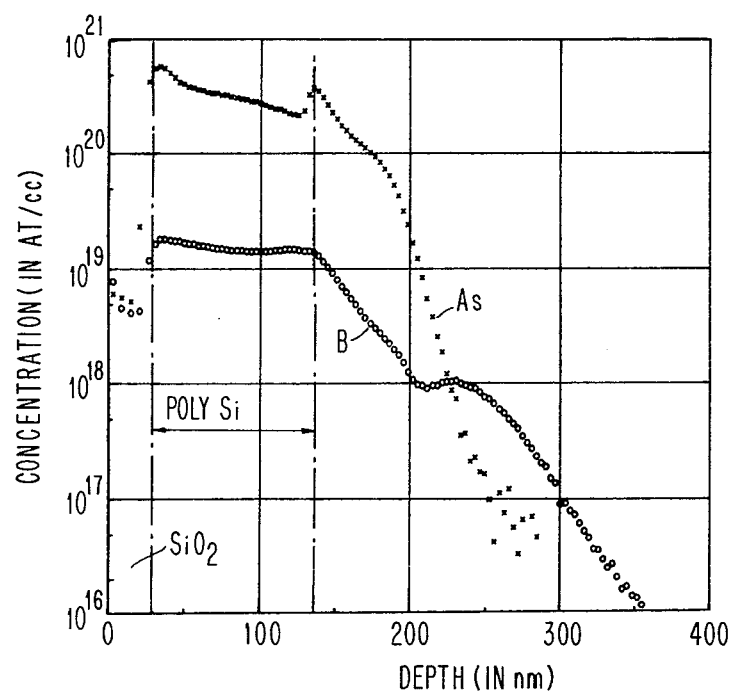
FIG. 14 is a diagram showing the diffusion profile which had been made according to the method of the present invention. A thicker layer of polycrystalline silicon is used in this diagram than in the earlier figures.

It has been found that under certain conditions, the boron may diffuse unexpectedly rapidly during the final drive in heat cycle. Referring to FIG. 13, the profile is shown following boron annealing and the subsequent arsenic implantation, but prior to the arsenic pre-anneal and final drive in. The boron profile is seen to be quite steep, as anticipated for diffusion out of the doped polycrystalline silicon source. The polycrystalline silicon film thickness is on the lower limit of acceptability, however, for the 40 KeV arsenic implantation energy used. It can be seen that a substantial portion of the arsenic has penetrated into the underlying monocrystalline layer as a result, even without any subsequent heat treatment. The result of further heat treatment is illustrated by the profile, in FIG. 12, which were prepared in the same manner as the sample of FIG. 13, but which were additionally subjected to the capping and heat cycles needed to complete the final drive in. While this profile is acceptable for many applications, a comparison of FIG. 12 and FIG. 13 shows that the boron in the base region has diffused unexpectedly far, such that some of the steepness of the profile has been lost. This is thought to be due to point defects created in the monocrystalline silicon by the penetration of the arsenic implantation through the relatively thin polycrystalline silicon film. These defects are in turn believed to cause enhanced boron diffusivity during subsequent heat cycles. FIG. 14 illustrates the final profile of a sample prepared with a thicker polysilicon layer and a slightly reduced arsenic implantation energy. This boron profile is seen to have remained steeper, in comparison to FIG. 12, resulting in a more desirable narrow base width, yet still containing a sufficiently high boron concentration to prevent punch-through.

These profiles, and their formation, are not affected by the background doping.

TABLE I

Figure 9:
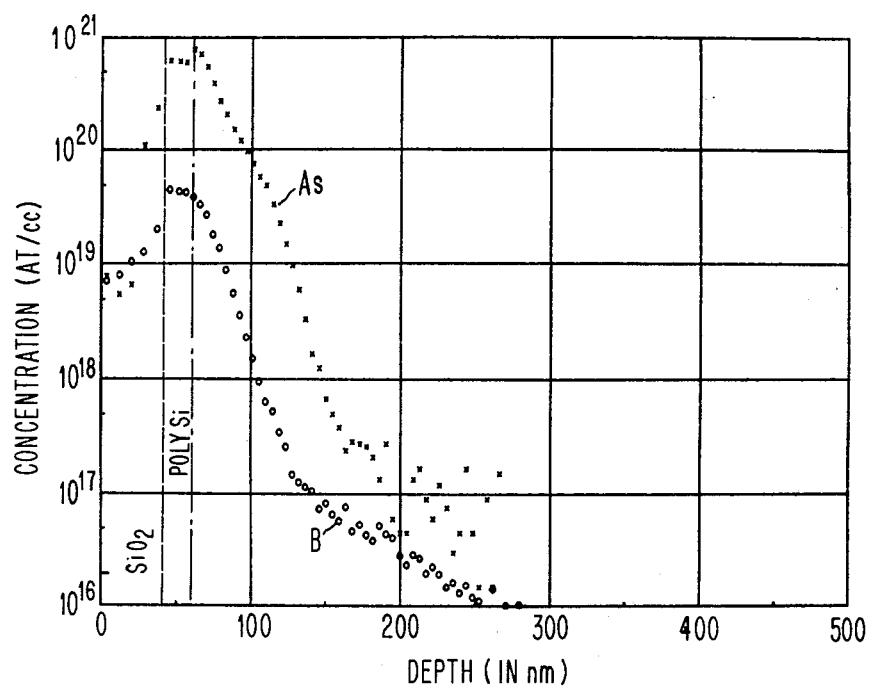
FIG. 9 is a diagram showing the diffusion profile wherein boron and arsenic ions were simultaneously diffused out of a double-implanted polycrystalline silicon layer.

| Substrate | Example 1 (FIG. 9) P—Si | Example 2 (FIG. 10) P—Si | Example 3 (FIG. 11) P—Si | Example 4 (FIG. 12) P—Si | Example 5 (FIG. 13) P—Si | Example 6 (FIG. 14) P—Si |
|---|---|---|---|---|---|---|
| Polycrystalline Silicon Thickness | 50 nm | 50 nm | 45 nm | 45 nm | 45 nm | 120 nm |
| Boron Implantation | $2 \times 10^{14}/cm^2$ $BF_2+$ at $30^2$ KeV | $2 \times 10^{14}/cm^2$ $BF_2+$ at $30^2$ KeV | $2 \times 10^{14}/cm^2$ $BF_2+$ at $30^2$ KeV | $2 \times 10^{14}/cm^2$ $BF_2+$ at $30^2$ KeV | $2 \times 10^{14}/cm^2$ $BF_2+$ at $30^2$ KeV | $2 \times 10^{14}/cm^2$ $B+$ at 6 KeV |
| First Anneal (Boron Pre-Diffusion) | None | 30 min. at 900° C. in $N_2$ | 60 min. at 900° C. in $N_2$ | 120 min. at 900° C. in $N_2$ | 120 min. at 900° C. in $N_2$ | 120 min. at 900° C. in $N_2$ |
| Arsenic Implantation | $2 \times 10^{15}/cm^2$ $As+$ at 40 KeV | $2 \times 10^{15}/cm^2$ $As+$ at 40 KeV | $2 \times 10^{15}/cm^2$ $As+$ at 40 KeV | $2 \times 10^{15}/cm^2$ $As+$ at 40 KeV | $2 \times 10^{15}/cm^2$ $As+$ at 40 KeV | $4 \times 10^{15}/cm^2$ $As+$ at 30 KeV |
| Emitter Drive-In (Final Heat Cycle) | 45 min. at 900° C. in $O_2$ | 45 min. at 900° C. in $O_2$ | 45 min. at 900° C. in $O_2$ | 45 min. at 900° C. in $O_2$ | None | 30 min. at 900° C. in $O_2$ + 30 min. at 950° C. in $N_2$ |

Figure 8:
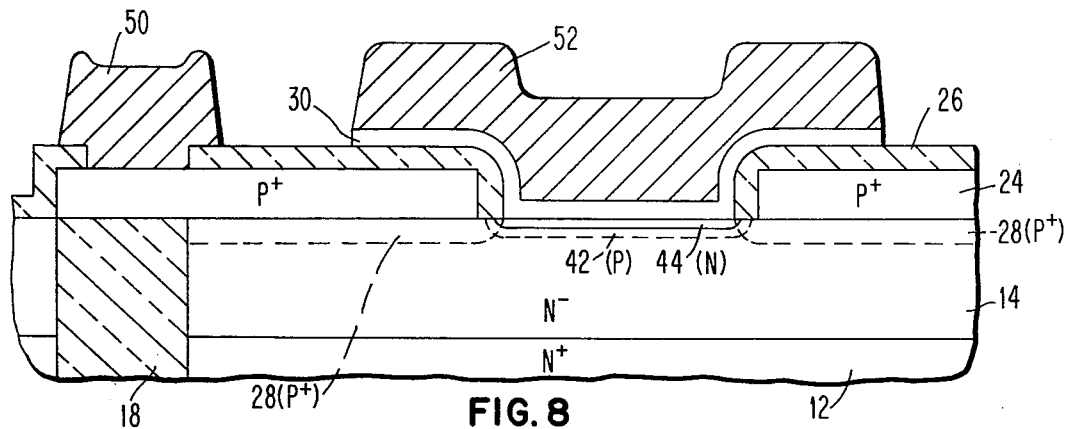

The device structure is completed by forming contact openings to the elements of the bipolar devices. It is preferred to leave the doped polycrystalline silicon layer 30 in the final device structure as the contact to the emitter region 44. The contact to the base region is polycrystalline silicon layer 24. Openings are made through any insulating layers such as silicon dioxide layers 22 and 26 to contact the base contact layer 24, the collector reach-through regions at 14, and emitter contact layer 42. A blanket layer of connecting metallurgy such as doped polycrystalline silicon, metal silicide, aluminum, aluminum-copper, combinations thereof or the like is formed over this surface of the device having the aforementioned openings therein. Conventional lithography and etching techniques are then used to delineate the connecting metallurgy in that blanket layer. In this manner base metal contact 50 and emitter metal contact 52 are formed as shown in FIG. 8.

The following examples are included merely to aid in the understanding of the invention. Variations may be made by one skilled in the art without departing from the spirit and scope of the invention.

Table I lists the pertinent experimental details of the examples given, which correspond to the profiles shown in FIGS. 9–14. The monocrystalline <100> silicon substrates used were P— (boron doped to give a resistivity of 10–20 Ω-cm), whereas in the normal practice of this invention N type background doping of approximately $2 \times 10^{16}/cm^3$ would be employed to result in an NPN transistor structure. However, the examples serve only to illustrate formation of the emitter and base profiles, towards which the invention is directed.

EXAMPLE 1

Table I provides the processing details for fabricating the boron and arsenic diffused structure. As indicated in Table I, Example 1 did not include a first anneal or boron pre-diffusion step, prior to implanting the arsenic. Thus, the emitter drive in heat cycle served to diffuse both the boron and arsensic simultaneously out of the doubly-doped polycrystalline silicon layer into the single crystalline silicon body. The diffusion profiles resulting are shown as FIG. 9.

Although there is some scatter at the data point at low concentrations, due to limitations in the measurement, extrapolation of the arsenic profile indicates a cross-over in about the $5 \times 10^{16} cm^{/3}$ range, corresponding to the concentration at the emitter-base junction. If a background N type doping of about $2 \times 10^{16}/cm^3$ is the collector region concentration, the profile gives a base width of only about 50 nanometers. This is an inadequate base width at the low doping levels in the base to prevent punch-through and resulting failure of the transistor device. Physically, this narrow base is caused by greatly reduced diffusivity of boron in the N+ silicon, so that it is largely immobilized as the arsenic diffusion front over takes it.

EXAMPLES 2, 3, AND 4

Figure 10:
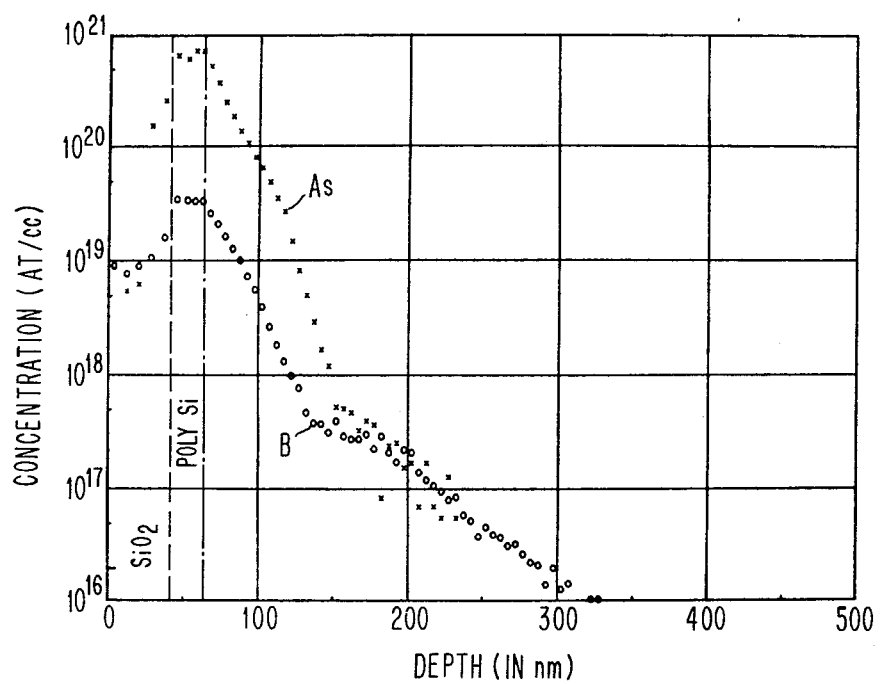
FIGS. 10, 11 and 12 are diagrams showing the diffusion profile of boron and arsenic from a polycrystalline silicon layer which have been processed according to the present invention wherein pre-diffusion of boron is made.
Figure 11:
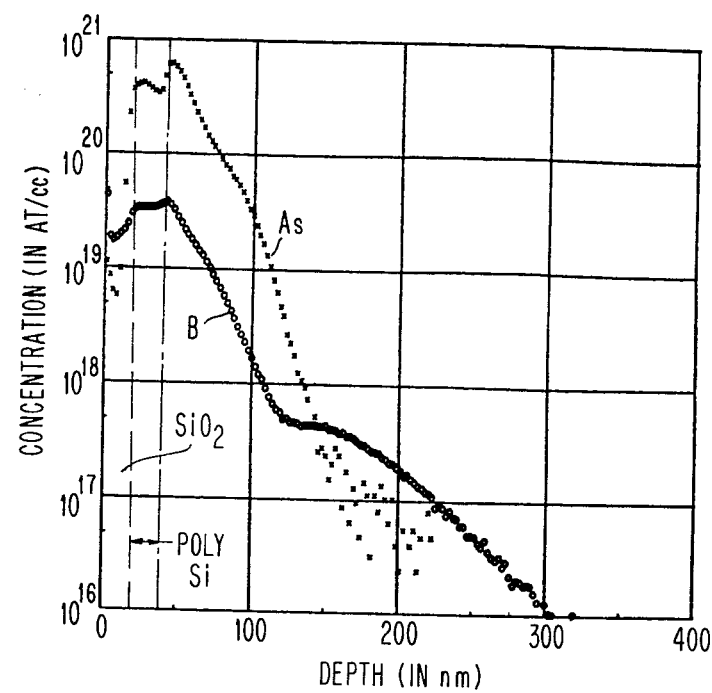

Examples 2, 3 and 4 are similar to Example 1, but they include additionally a first anneal cycle as described in the invention. The duration of the heat cycle was varied, as shown in Table I, from 30 to 60 to 120 minutes, respectively. The final profiles resulting are shown in FIGS. 10, 11, and 12. They illustrate the effect of the pre-diffusion in giving the boron a head start before the arsenic diffuses out of the polycrystalline silicon layer, resulting in increasing base widths and increasing base doping levels beyond the emitter junction. With a typical N type background doping of $2 \times 10^{16}/cm^3$ in the collector, the base widths would be about 120 nm, 135 nm, and 170 nm for the respective examples given. The base doping levels at the emitter-base junction are seen to be about $4 \times 10^{17}/cm^3$, $5 \times 10^{17}/cm^3$, and $9 \times 10^{17}/cm^3$, respectively, considerably higher than in Example 1 which had no base pre-diffusion.

EXAMPLE 5

This example used a process identical to the one described in Example 4, except that no final emitter drive in heat cycle was included. FIG. 13, illustrating Example 5, may therefore be viewed as the impurity profile of a partially completed structure, and as such is instructive in suggesting the most favorable conditions for application of the present invention. FIG. 13 shows the steep boron profile resulting from diffusion out of the implanted polycrystalline silicon film. The arsenic profile is shown as implanted, and extends considerably into the monocrystalline silicon body, due to the relatively thin polycrystalline silicon layer used relative to the 40 KeV arsenic implantation energy. Comparing this to FIG. 12, which shows an identical sample which has had the additional emitter drive in heat cycle, it can be seen that the boron profile has diffused surprisingly far beyond the arsenic diffusion front during this final heat cycle. It is believed that damage from the arsenic implantation, as well as the arsenic dopant itself, has penetrated into the monocrystalline silicon body and increased the diffusivity of the boron. This suggests that thicker polycrystalline silicon and/or reduced arsenic implantation energy will minimize the enhanced born diffusivity by largely limiting the implantation damage to the polycrystalline silicon layer.

EXAMPLE 6

In this example, a number of experimental parameters have been modified slightly for optimization. Specifically, the polycrystalline silicon layer has been more than doubled over that in the previous examples, and the arsenic implantation energy slightly reduced as well. FIG. 14 shows that with a process including these modifications, the resulting boron profile in the base region has retained more of its steepness through the final drive in heat cycle, providing a narrow, relatively highly-doped base. For a background N type doping level of $2\times10^{16}/cm^3$, a base width of about 110 nm results with a peak boron concentration of about $1\times10^{18}/cm^3$ at the emitter junction. This combination of narrow base and high doping level is particularly desirable for certain circuit applications.

While the invention has been particularly shown and described with reference to the preferred embodiments thereof, it will be recognized by those skilled in the art that the foregoing and other changes in form and details may be made without departing from the spirit and scope of the invention.

What is claimed is:

1. The method of forming the emitter and base regions of an NPN bipolar transistor comprising:
   depositing a polycrystalline silicon layer over a monocrystalline silicon surface in which the base and emitter regions of said transistor are to be formed;
   ion implanting boron ions into the said polycrystalline silicon layer near the interface of said polycrystalline silicon layer with said monocrystalline silicon;
   first annealing the layered structure to partially drive the said boron ions into said monocrystalline silicon;
   ion implanting arsenic ions into said polycrystalline silicon layer; and
   second annealing the layered structure to fully drive in the said boron and arsenic to form said base and emitter regions of said transistor.

2. The method of claim 1 wherein the said base region is the intrinsic base region of said NPN transistor and said extrinsic base region is formed by another process to be contiguous with said intrinsic base region.

3. The method of claim 1 wherein said polycrystalline silicon layer remains in the final structure as the contact to said emitter region.

4. The method of claim 1 wherein the thickness of said polycrystalline silicon layer is between about 50 to 500 nanometers.

5. The method of claim 1 wherein said first annealing is at a temperature between about 800° C. to 1000° C.

6. The method of claim 1 wherein a silicon dioxide capping layer is formed over said polycrystalline silicon layer after said ion implanting boron ions and before said first annealing, and removing said capping layer after said first annealing.

7. The method of claim 1 wherein said polycrystalline silicon layer has a doping level of between about $5\times10^{18}$ to $5\times10^{19}$ boron atoms/cc, and between about $5\times10^{19}$ to $2\times10^{21}$ arsenic atoms/cc.

8. The method of claim 2 wherein the said extrinsic base region is formed from an outdiffusion from a doped polycrystalline silicon layer which remains in the final structure as the contact to said intrinsic base region.

9. The method of claim 4 wherein the said ion implanting of boron ions use between about 5 to 30 KeV and said ion implanting of arsenic ions use between about 5 to 40 KeV.

10. The method of claim 5 wherein said second annealing is at a temperature between about 850° C. to 1000° C.

11. The method of claim 10 wherein said first and second annealing are done in a nitrogen ambient.

12. The method of claim 7 wherein the resulting PN base-emitter junction is between about 20 to 200 nanometers in depth.

13. The method of forming NPN transistors in an integrated circuit comprising:
   providing a silicon semiconductor body having regions of monocrystalline silicon dielectrically isolated from one another by dielectric isolating regions;
   providing a mask layer over said body covering that region designated to be the collector reach-through region and open to those designated as emitter, intrinsic base and extrinsic base regions;
   forming a first P type doped polycrystalline silicon layer over the surface of said body wherein the said polycrystalline silicon layer makes ohmic contact to said extrinsic base region;
   removing the said polycrystalline silicon layer from over said mask layer where said collector reach-through region is made; forming an insulating layer over said surface and using lithography removing said insulating layer and said polycrystalline silicon layer from said regions where said regions designated to be the emitter and intrinsic base are to be made;
   forming an insulating layer over said surface;
   removing said insulating layer from over said surface to form a sidewall on the sides of said first P type doped layer defined by the region designated to be the emitter and intrinsic base;
   forming a second polycrystalline silicon layer over said regions in said body designated to be the emitter and intrinsic base;
   ion implanting boron ions into the said second polycrystalline silicon layer near the interface of said polycrystalline silicon layer with said monocrystalline silicon body;

first annealing the layered structure to partially drive in the said boron and the P type impurities from said first P doped layer and said second polycrystalline silicon layer into said monocrystalline silicon body;

ion implanting arsenic ions into said second polycrystalline silicon layer;

second annealing the layered structure to fully drive in the said boron P type impurity and arsenic into the appropriately designated regions to form the intrinsic base, extrinsic base and emitter of said NPN transistors; and making electrical contact to the elements of said NPN transistor.

14. The method of claim 13 wherein said first P type doped polycrystalline silicon layer is doped with boron impurities at a doping level of between about $1 \times 10^{18}$ to $1 \times 10^{21}$ atoms/cc.

15. The method of claim 13 wherein said first polycrystalline silicon layer remains in the final integrated circuit structure as the electrical contact to said base region and said second polycrystalline silicon remains in the final integrated circuit structure as the electrical contact to said emitter region.

16. The method of claim 13 wherein the thickness is of said second polycrystalline silicon layer is between about 50 to 500 nanometers.

17. The method of claim 13 wherein said first annealing is at a temperature between about 800° C. to 1000° C. and said second annealing is at a temperature between about 850° C. to 1000° C.

18. The method of claim 13 wherein a silicon dioxide capping layer is formed over said second polycrystalline silicon layer after said ion implanting boron ions and before said first annealing, and removing said capping layer after said first annealing.

19. The method of claim 13 wherein said second polycrystalline silicon layer has a doping level of between about $5 \times 10^{18}$ to $5 \times 10^{19}$ boron atoms/cc, and between about $5 \times 10^{19}$ to $2 \times 10^{21}$ arsenic atoms/cc, and the resulting PN base-emitter junction is between about 20 to 200 nanometers in depth.

20. The method of claim 16 wherein the said ion implanting of boron ions use between about 5 to 30 KeV and said ion implanting of arsenic ions use between about 5 to 40 KeV.

* * * * *